US012084765B2

(12) United States Patent
Igarashi (10) Patent No.: US 12,084,765 B2
(45) Date of Patent: Sep. 10, 2024

(54) PROCESSING APPARATUS AND PROCESSING METHOD (71) Applicant: TOKYO ELECTRON LIMITED, Tokyo (JP)

(72) Inventor: Reita Igarashi, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 65 days.

(21) Appl. No.: 17/590,799

(22) Filed: Feb. 1, 2022

(65) Prior Publication Data
US 2022/0243329 A1 Aug. 4, 2022

(30) Foreign Application Priority Data

Feb. 2, 2021 (JP) .................................. 2021-015290

(51) Int. Cl.
*C23C 16/455* (2006.01)
*H01L 21/22* (2006.01)
(52) U.S. Cl.
CPC .. *C23C 16/45548* (2013.01); *C23C 16/45578* (2013.01); *H01L 21/22* (2013.01)
(58) Field of Classification Search
None
See application file for complete search history.

(56) References Cited

U.S. PATENT DOCUMENTS

| 5,441,570 | A | * | 8/1995 | Hwang | .................. | C23C 16/455 |
| | | | | | | 118/725 |
| 6,929,699 | B2 | * | 8/2005 | Whitesell | .............. | C23C 16/455 |
| | | | | | | 118/724 |
| 2011/0039420 | A1 | * | 2/2011 | Nakao | .................... | H01L 21/312 |
| | | | | | | 427/255.6 |

FOREIGN PATENT DOCUMENTS

| JP | 09097768 A | * | 4/1997 |
| JP | H9-97768 A | | 4/1997 |
| JP | 2001-110730 A | | 4/2001 |

* cited by examiner

*Primary Examiner* — Karla A Moore
(74) *Attorney, Agent, or Firm* — Nath, Goldberg & Meyer; Jerald L. Meyer; Tanya E. Harkins (57) ABSTRACT

A processing apparatus includes: a processing container; a first injector extending in a longitudinal direction along an inner wall of the processing container, wherein the first injector includes a first introduction port formed at a lower end and first gas holes formed in the extending portion; and a second injector extending upward along the inner wall of the processing container, folded back at an upper portion, and then extending downward, wherein the second injector includes a second introduction port formed at a lower end of an upward extending portion and second gas holes formed in a downward extending portion. The first injector includes a first throttle portion having a cross-sectional area decreasing as a distance from the first introduction port increases. The second injector includes a second throttle portion formed in the downward extending portion and having a cross-sectional area decreasing as a distance from the second introduction port increases.

6 Claims, 13 Drawing Sheets

PROCESSING APPARATUS AND PROCESSING METHOD

CROSS-REFERENCE TO RELATED APPLICATION

This application is based upon and claims the benefit of priority from Japanese Patent Application No. 2021-015290, filed on Feb. 2, 2021, the entire contents of which are incorporated herein by reference.

TECHNICAL FIELD

The present disclosure relates to a processing apparatus and a processing method.

BACKGROUND

There is known a substrate processing apparatus that includes a processing container accommodating a boat on which a substrate is mounted, and an injector extending vertically along an inner wall of the processing container in the vicinity of the processing container and having gas holes in the longitudinal direction thereof (see, for example, Patent Documents 1 and 2). Patent Document 1 discloses a gas injector having a pipe diameter that decreases as the distance from a gas supply port increases. Patent Document 2 discloses an apparatus provided with a first gas introduction pipe made of a straight pipe and a second gas introduction pipe made of a U-shaped pipe.

PRIOR ART DOCUMENT

Patent Document

Patent Document 1: Japanese Laid-Open Patent Publication No. 9-097768
Patent Document 2: Japanese Laid-Open Patent Publication No. 2001-110730

SUMMARY

According to one embodiment of the present disclosure, there is provided a processing apparatus including: a processing container having a cylindrical shape; a first injector extending in a longitudinal direction along an inner side of an inner wall of the processing container, wherein the first injector includes a first introduction port formed at a lower end and first gas holes formed in the extending portion; and a second injector extending upward along the inner side of the inner wall of the processing container, folded back at an upper portion, and then extending downward, wherein the second injector includes a second introduction port formed at a lower end of an upward extending portion and second gas holes formed in a downward extending portion. The first injector includes a first throttle portion having a cross-sectional area decreasing as a distance from the first introduction port increases. The second injector includes a second throttle portion formed in the downward extending portion and having a cross-sectional area decreasing as a distance from the second introduction port increases.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. In all of the accompanying drawings, the same or corresponding members or components will be denoted by the same or corresponding reference numerals, and redundant descriptions will be omitted.

[Processing Apparatus]

Figure 1:
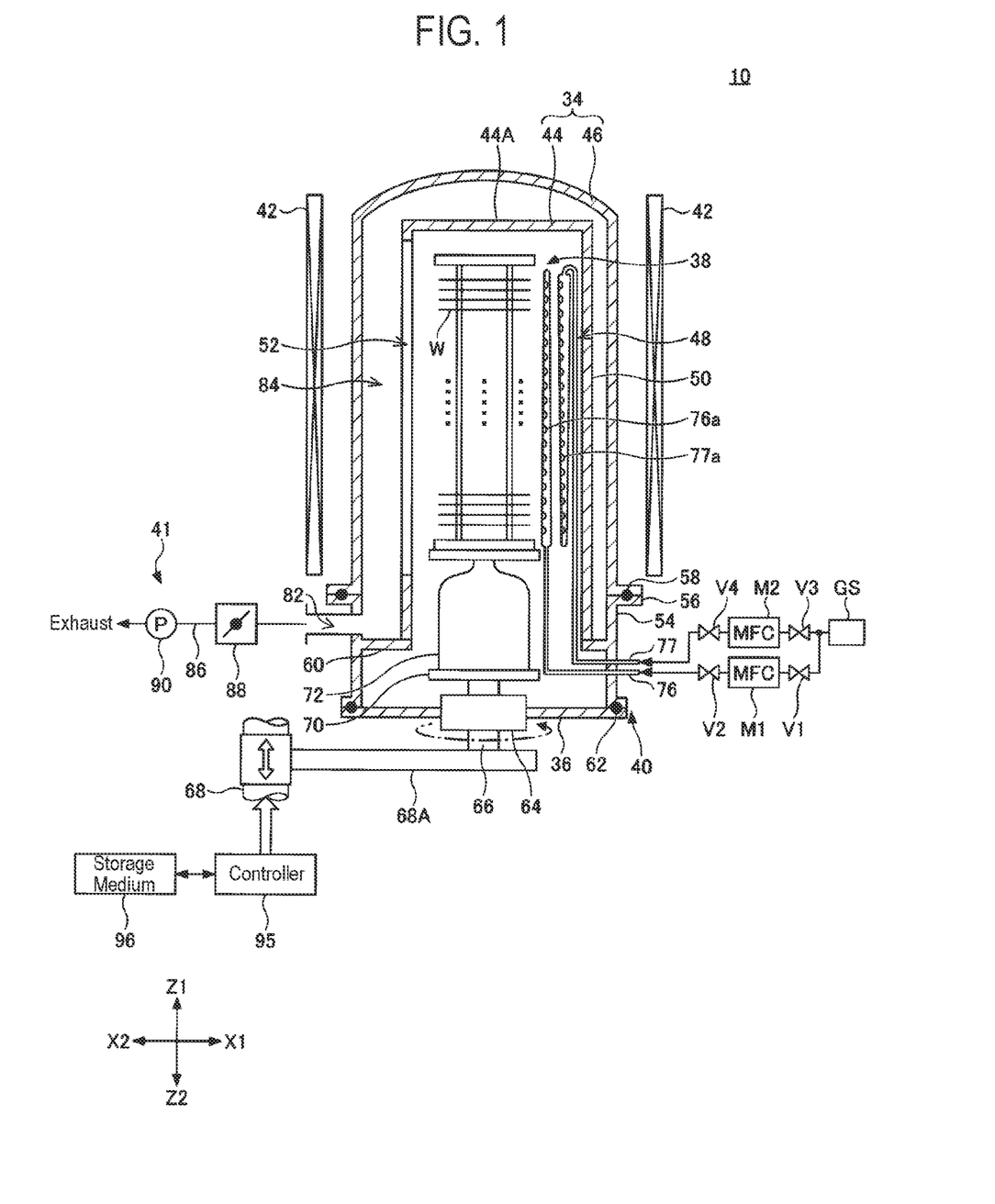
FIG. 1 is a schematic view illustrating an example of a processing apparatus according to an embodiment.

An example of a processing apparatus of an embodiment will be described with reference to FIG. 1. The processing apparatus of the embodiment is a batch-type vertical processing apparatus that is capable of forming a film on substrates simultaneously and collectively. The processing apparatus of the embodiment is an apparatus for depositing a film on a substrate through, for example, chemical vapor deposition (CVD) or atomic layer deposition (ALD).

The processing apparatus 10 includes a processing container 34 configured to accommodate therein a substrate W and a lid 36 configured to close an opening at the lower end of the processing container 34 on the Z2 side. The substrate W is, for example, a semiconductor wafer such as a silicon wafer. In addition, the processing apparatus 10 includes a boat 38 capable of being accommodated in the processing container 34 and configured to hold substrates W at predetermined intervals, a gas supply part 40 configured to supply gas into the processing container 34, and an exhaust part 41 configured to exhaust gas in the processing container 34. A heater 42 configured to heat the interior of the processing container 34 is provided outside the processing container 34.

The processing container 34 includes a substantially cylindrical inner tube 44 having a lower open end on the Z2 side and a ceiling 44A on the Z1 side, and a substantially cylindrical outer tube 46 having a lower end on the Z2 side and a ceiling on the Z1 side and configured to cover the exterior of the inner tube 44. The inner tube 44 and the outer tube 46 are formed of a heat-resistant material such as quartz, and are coaxially arranged in the Z1-Z2 direction to form a double-tube structure.

The ceiling 44A of the inner tube 44 is, for example, flat. Inside the inner tube 44, a nozzle accommodation part 48 configured to accommodate therein gas injectors 76 and 77, which will be described later, are formed in the Z1-Z2 direction. A portion of the side wall of the inner tube 44 includes a convex portion 50 formed to protrude outward in the X1 direction, and the interior of the formed convex portion 50 may be used as a nozzle accommodation part 48. In the side wall on the X2 side opposite to the inner tube 44 facing the nozzle accommodation part 48A, a rectangular opening 52 having a predetermined width L1 is formed in the Z1-Z2 direction.

The opening 52 is an exhaust port configured to evacuate the interior of the inner tube 44. The length of the opening 52 in the Z1-Z2 direction is equal to or longer than the length of the boat 38. That is, at the upper end on the Z1 side of the opening 52s, the opening 52 is formed to be longer on the Z1 side than the position corresponding to the upper end of the boat 38, and, at the lower end on the Z2 side of the opening 52, the opening 52 is formed to be longer on the Z2 side than the position corresponding to the lower end of the boat 38.

The lower end of the processing container 34 on the Z2 side is supported by a substantially cylindrical manifold 54 formed of, for example, stainless steel. A flange 56 is formed at the upper end of the manifold 54 on the Z1 side, and the lower end of the outer tube 46 on the Z2 side is connected to the flange 56. A seal member 58 such as an O-ring is provided between the flange 56 and the outer tube 46, and the flange 56 and the outer tube 46 are connected to each other via the seal member 58. Herein, a region surrounded by the processing container 34, the manifold 54, and the lid 36 inside the processing container 34 may be referred to as the interior of the processing container.

An annular support portion 60 is provided on the inner wall on the Z1 side, which is the upper portion of the manifold 54, and the lower end of the inner tube 44 on the Z2 side is installed on the support portion 60 so as to be supported thereon. The lid 36 is installed the opening at the lower end of the manifold 54 on the Z2 side via a seal member 62 such as an O-ring, thereby hermetically blocking the opening of the processing container 34 at the lower end on the Z2 side, that is, the opening of the manifold 54. The lid 36 is formed of, for example, stainless steel.

Through the central portion of the lid 36, a rotary shaft 66 is provided via a magnetic fluid seal 64. A lower portion of the rotary shaft 66 on the Z2 side is rotatably supported on an arm 68A of an elevating part 68 configured as a boat elevator.

A rotary plate 70 is provided at the upper end of the rotary shaft 66 on the Z1 side, and the boat 38 that holds substrates W is placed on the rotary plate 70 via a heat-retaining stage 72 made of quartz. Accordingly, by raising and lowering the arm 68A by the elevating part 68, the lid 36 and the boat 38 move upward and downward integrally, so that the boat 38 can be put in and out of the processing container 34.

The gas supply part 40 is provided in the manifold 54 and can supply the processing gas to the inside of the inner tube 44. The processing gas includes, for example, a raw-material gas and an additive gas. The raw-material gas is a gas for depositing a film on a substrate W, and may be a silicon-containing gas, such as monosilane ($SiH_4$) or disilane ($Si_2H_6$). The additive gas is a gas for diluting the raw-material gas, and may be an inert gas such as nitrogen ($N_2$) or argon (Ar). The gas supply part 40 has two injectors 76 and 77 made of quartz. However, the gas supply part 40 may have yet another injector. The injectors 76 and 77 each have gas holes 76a and gas holes 77a for injecting the processing gas. The details of the injectors 76 and 77 will be described later.

On the outer peripheral side of the outer tube 46, a substantially cylindrical heater 42 is provided to surround the periphery of the outer tube 46. By the heater 42, the substrates W accommodated in the processing container 34 and the gas in the injectors 76 and 77 can be heated.

A processing gas source GS is connected to the injector 76 via a valve V1, a flow controller M1, and a valve V2. The processing gas source GS is connected to the injector 77 via a valve V3, a flow controller M2, and a valve V4. That is, the injectors 76 and 77 are connected to the same processing gas source GS. However, the injectors 76 and 77 may be connected to different processing gas sources.

In the injector 76, the processing gas from the processing gas source GS is introduced into the injector 76 via the valves V1 and V2 under the control of the flow controller M1 and ejected to the interior of the inner tube 44 of the processing container 34 from the gas holes 76a. In the injector 77, the processing gas from the processing gas source GS is introduced into the injector 77 via the valves V3 and V4 under the control of the flow controller M2 and ejected to the interior of the inner tube 44 of the processing container 34 from the gas holes 77a.

Since an exhaust port 82 is provided in the upper side wall of the manifold 54 on the Z1 side and above the support portion 60, the gas inside the inner tube 44 is exhausted from the opening 52 and through the space 84 between the inner tube 44 and the outer tube 46. The exhaust part 41 is connected to the exhaust port 82. The exhaust part 41 is provided with a pressure adjustment valve 88, an exhaust passage 86, and a vacuum pump 90 in this order from the exhaust port 82, and is capable of evacuating the interior of the processing container 34.

In the present embodiment, substrates W are installed inside the inner tube 44 in the Z1-Z2 direction perpendicular to wafer surfaces to be the substrate surfaces. The processing gas is ejected to the spaces between the substrates W from the gas holes 76a and 77a formed in the injectors 76 and 77. The ejected processing gas passes the spaces between the substrates W so that the substrates W are processed. However, the gas that does not contribute to the processing goes out of the inner tube 44 through the opening 52 on the X2 side and passes through the space 84 between the inner tube 44 and the outer tube 46, to be exhausted from the exhaust port 82.

The overall operation of the processing apparatus 10 is controlled by a controller 95 such as a computer. A computer program that performs the overall operation of the processing apparatus 10 may be stored in a storage medium 96. The storage medium 96 may be, for example, a flexible disk, a compact disk, a hard disk, a flash memory, or a DVD.

[Injector]

Figure 2:
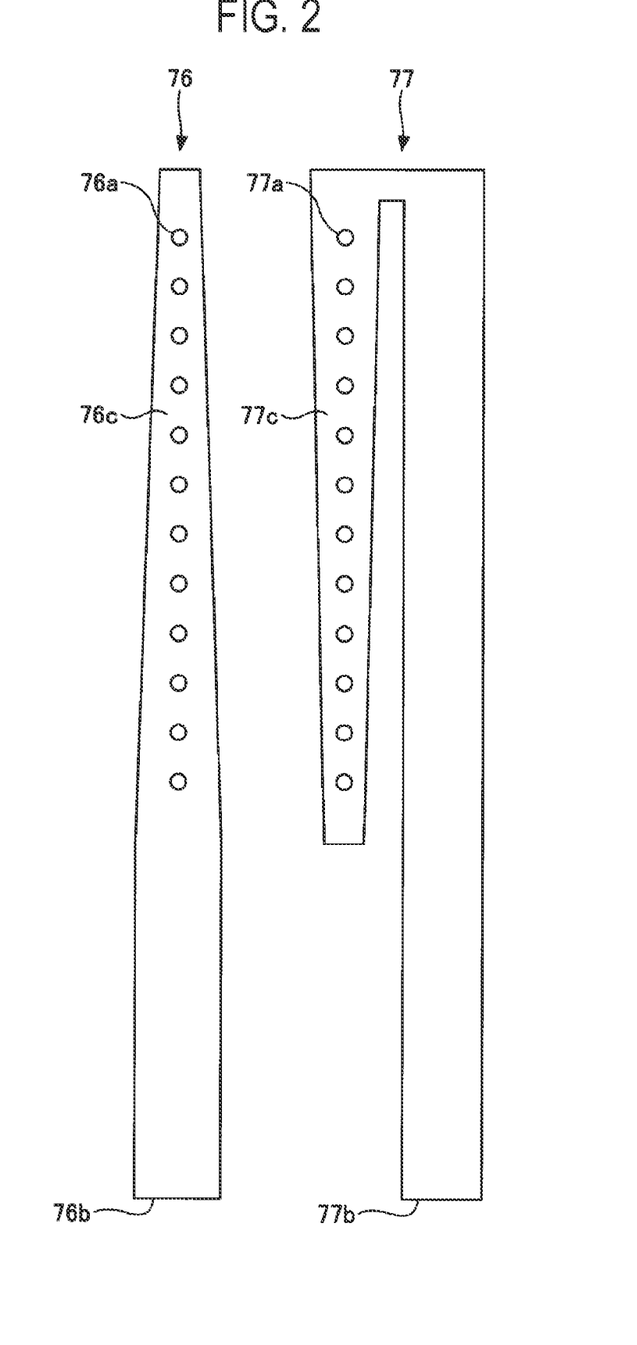
FIG. 2 is a schematic view of in injector when viewed from the center side in the radial direction of the processing container.
Figure 3:
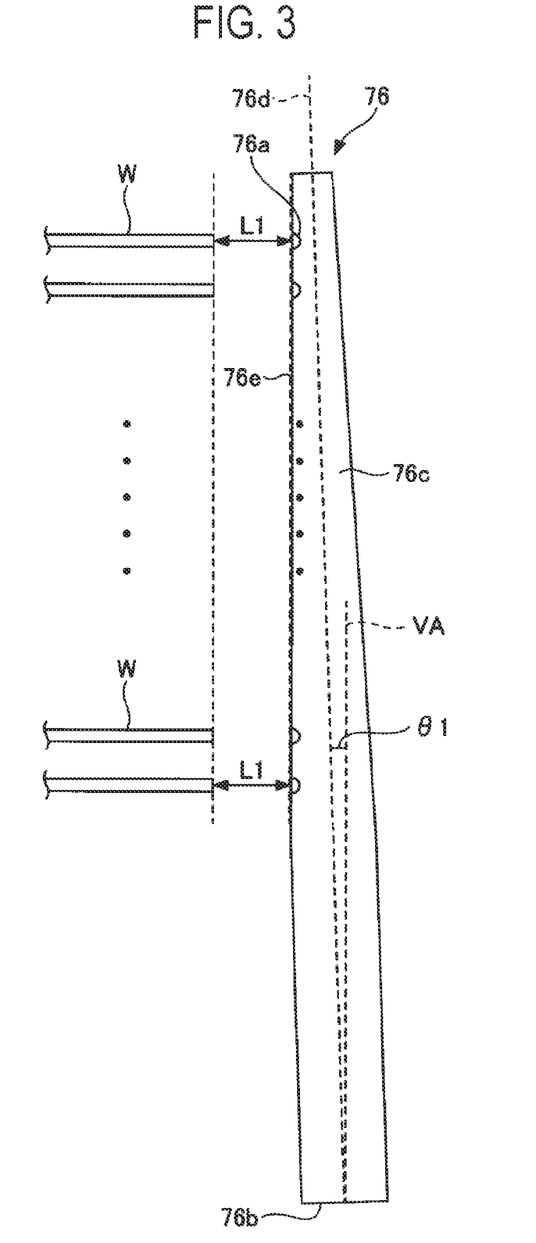
FIG. 3 is a schematic view of an injector when viewed from the circumferential direction of a processing container.
Figure 4:
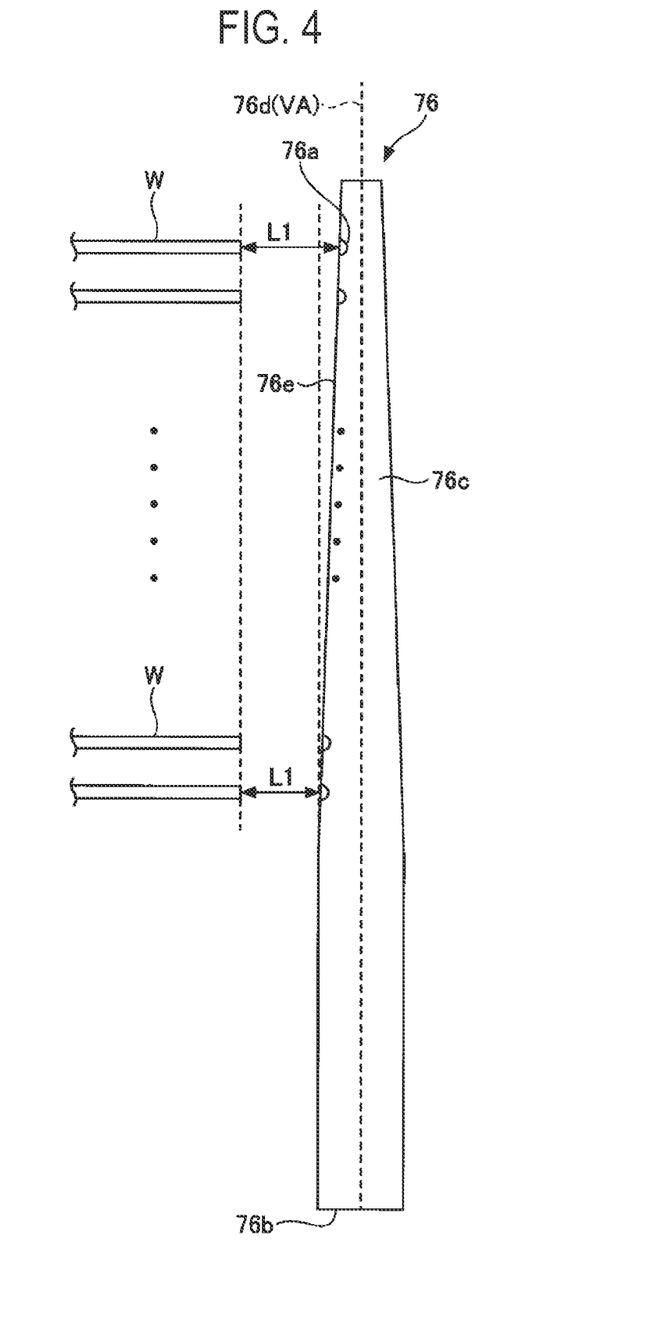
FIG. 4 is a schematic view of an injector when viewed from the circumferential direction of a processing container.

An example of the injector 76 provided in the processing apparatus 10 of FIG. 1 will be described with reference to FIGS. 2 to 4 in addition to FIG. 1. FIG. 2 is a schematic view of the injectors 76 and 77 when viewed from the center side in the radial direction of the processing container 34. FIGS. 3 and 4 are schematic views of the injector 76 when viewed from the circumferential direction of the processing container 34.

The injector 76 is an upright diffusion injector that extends in the longitudinal direction along the inner side of the inner wall of the processing container 34 and has gas holes 76a formed at predetermined intervals along the longitudinal direction in the extending portion. The injector 76 has an opening at the lower portion to form an introduction port 76b into which the processing gas is introduced, and the upper portion is closed.

The injector 76 includes a throttle portion 76c having a cross-sectional area that decreases as the distance from the introduction port 76b increases. This makes it possible to suppress a decrease in the flow velocity on the downstream side of the gas flow. Thus, the uniformity of the mass flow rate of the processing gas in the vertical direction is improved. The throttle portion 76c has a truncated cone shape. However, the shape of the throttle portion 76c is not limited thereto, and may be, for example, a cone shape, a pyramid shape, or a truncated pyramid shape.

The gas holes 76a are formed in the throttle portion 76c. However, some of the gas holes 76a may be formed at a position other than the throttle portion 76c. The gas holes 76a are oriented toward the center of the processing container 34. As a result, the gas holes 76a eject the processing gas introduced from the introduction port 76b toward the center of the processing container 34 in a substantially horizontal direction. However, the gas holes 76a may be oriented toward a direction different from the center side of the processing container 34, for example, toward the inner wall side of the processing container 34.

The gas holes 76a are arranged at predetermined intervals in the vertical direction. The predetermined intervals is, for example, the same as the intervals of the substrates W supported by the boat 38. The position of each of the gas holes 76a in the Z1-Z2 direction is located at an intermediated position between adjacent substrates W in the Z1-Z2 direction so that the processing gas can be efficiently supplied to the spaces between the substrates W. However, the predetermined intervals between the gas holes 76a are not limited to the above. A gas hole may be provided for each of the substrates W. Further, the position of each gas hole 76a is not limited to the intermediate position between adjacent substrates W, and may be provided at any position such as the same height as a substrate W.

As illustrated in FIG. 3, the injector 76 is disposed such that the pipe axis 76d is inclined by an angle θ1 relative to the vertical axis Va toward the center side of the processing container 34 to cause the surface 76e in which the gas holes 76a are formed in the throttle portion 76c to be parallel to the vertical direction. As a result, the distance L1 between the substrates W and the surface 76e in which the gas holes 76a are formed in the throttle portion 76c becomes equal for all of the substrates W. However, as illustrated in FIG. 4, the injector 76 may be disposed such that the pipe axis 76d is parallel to the vertical axis VA, and the surface 76e in which the gas holes 76a are formed in the throttle portion 76c is disposed to have an angle relative to the vertical axis VA. In the example of FIG. 4, the distance L1 between the substrates W and the surface 76e in which the gas holes 76a are formed in the throttle portion 76c is longer in the upper portion than in the lower portion.

Figure 5:
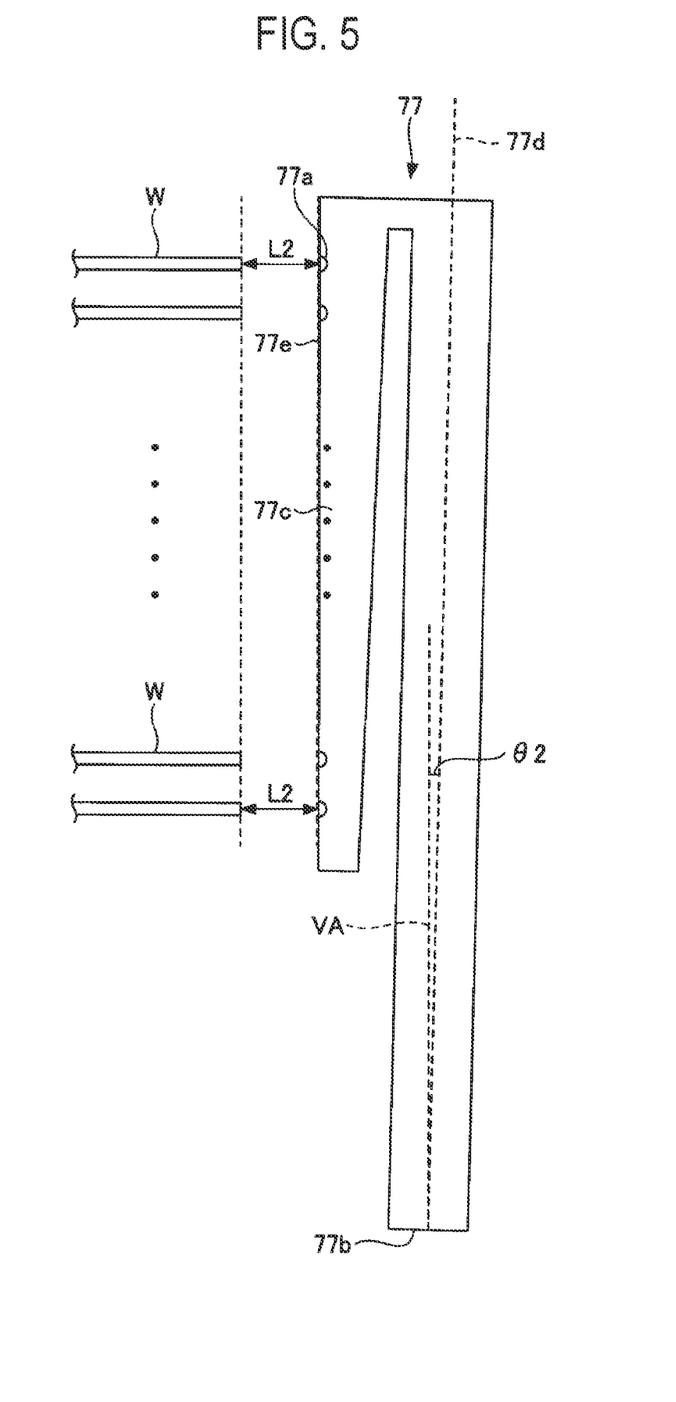
FIG. 5 is a schematic view of an injector when viewed from the circumferential direction of a processing container.
Figure 6:
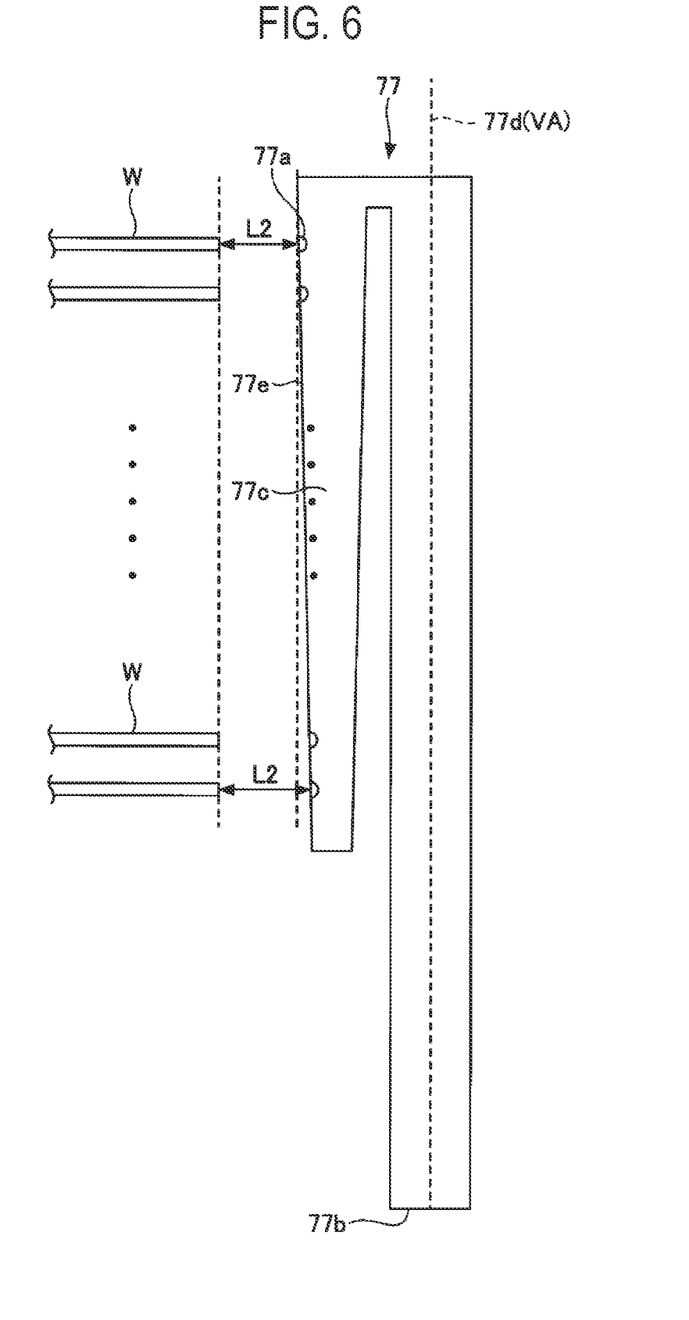
FIG. 6 is a schematic view of an injector when viewed from the circumferential direction of a processing container.

Next, an example of the injector 77 provided in the processing apparatus 10 in FIG. 1 will be described with reference to FIGS. 5 and 6 in addition to FIGS. 1 and 2. FIGS. 5 and 6 are schematic views of the injector 77 when viewed from the circumferential direction of the processing container 34.

The injector 77 is a folded diffusion injector that extends upward along the inner side of the inner wall of the processing container 34, is folded at the upper portion, and then extends downward, and has gas holes 77a formed at predetermined intervals along the longitudinal direction in the downward extending portion. The injector 77 is provided at a position adjacent to the injector 76 in the circumferential direction of the processing container 34. However, the injector 77 may be provided at a position adjacent to the injector 76 in the radial direction of the processing container 34.

In the injector 77, the lower portion of the upward extending portion is opened to form an introduction port 77b into which the processing gas is introduced, and the lower portion of the downward extending portion is closed.

The downward extending portion of the injector 77 includes a throttle portion 77c having a cross-sectional area that decreases as the distance from the introduction port 77b increases. This makes it possible to suppress a decrease in the flow velocity on the downstream side of the gas flow. Thus, the uniformity of the mass flow rate of the processing gas in the vertical direction is improved. The throttle portion 77c has a truncated cone shape. However, the shape of the throttle portion 77c is not limited thereto, and may be, for example, a cone shape, a pyramid shape, or a truncated pyramid shape.

The gas holes 77a are formed in the throttle portion 77c. However, some of the gas holes 77a may be formed at a position other than the throttle portion 77c. The gas holes 77a are oriented toward the center of the processing container 34. As a result, the gas holes 77a eject the processing gas introduced from the introduction port 77b toward the center of the processing container 34 in a substantially horizontal direction. However, the gas holes 77a may be oriented toward a direction different from the center side of the processing container 34, for example, toward the inner wall side of the processing container 34.

The gas holes 77a are arranged at predetermined intervals in the vertical direction. The predetermined interval is, for example, the same as the interval of the substrates W supported by the boat 38. The position of each of the gas holes 77a in the Z1-Z2 direction is located at an intermediated position between adjacent substrates W in the Z1-Z2 direction so that the processing gas can be efficiently supplied to the spaces between the substrates W. However, the predetermined intervals between the gas holes 77a are not limited to the above. A gas hole may be provided for each of the substrates W. Further, the position of each gas hole 77a is not limited to the intermediate position between adjacent substrates W. and may be provided at any position such as the same height as a substrate W.

As illustrated in FIG. 2, the gas holes 77a are disposed at the same height positions as the gas holes 76a, respectively. However, the gas holes 77a may be disposed at different height positions from the gas holes 76a, respectively.

As illustrated in FIG. 5, the injector 77 is disposed such that the pipe axis 77d is inclined by an angle θ2 relative to the vertical axis Va toward the inner wall side of the processing container 34 to cause the surface 77e in which the gas holes 77a are formed in the throttle portion 77c to be parallel to the vertical axis VA. As a result, the distance L2 between the substrates W and the surface 77e in which the gas holes 77a are formed in the throttle portion 77c becomes equal for all of the substrates W. However, as illustrated in FIG. 6, the injector 77 may be disposed such that that the pipe axis 77d is parallel to the vertical axis VA, and the surface 77e in which the gas holes 77a are formed in the throttle portion 77c is disposed to have an angle relative to the vertical axis VA. In the example of FIG. 6, the distance L2 between the substrates W and the surface 77e in which the gas holes 77a are formed in the throttle portion 77c is longer in the lower portion than in the upper portion.

Figure 7:
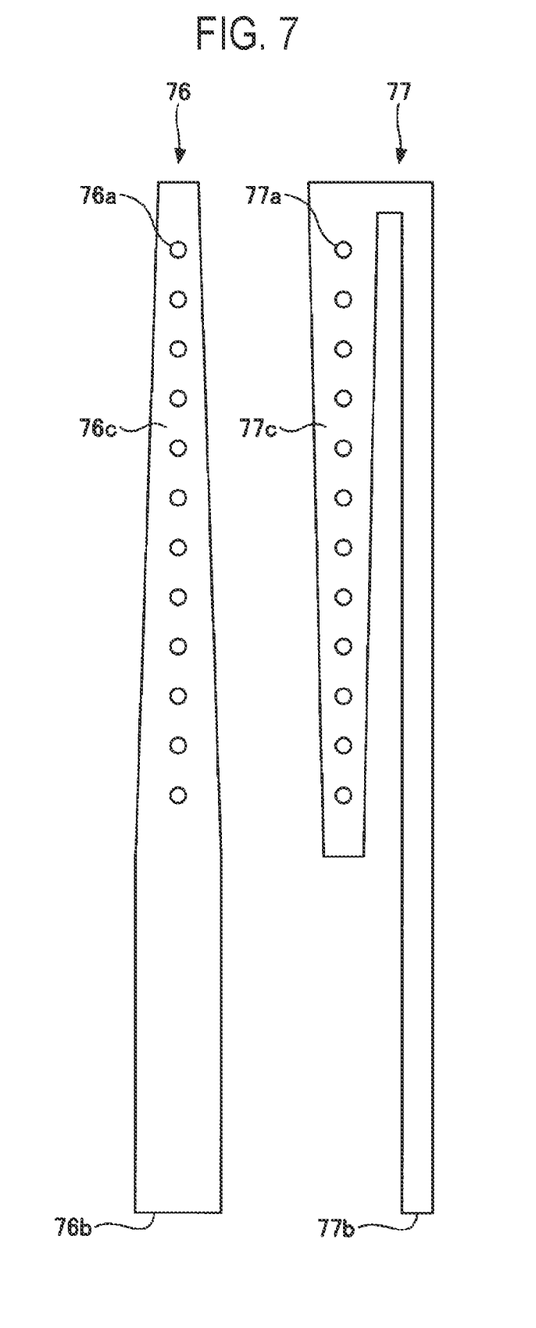
FIG. 7 is a schematic view of in injector when viewed from the center side in the radial direction of the processing container.

In addition, as illustrated in FIG. 2, in the injector 77, the cross-sectional area of the portion extending upward is the same as the cross-sectional area of the upper portion of the downward extending portion. However, as illustrated in FIG. 7, in the injector 77, the cross-sectional area of the upward extending portion is preferably smaller than the cross-sectional area of the upper portion of the downward extending portion. As a result, the flow velocity until the processing gas introduced into the injector 77 from the introduction port 77b reaches the throttle portion 77c increases, and the residence time until the processing gas reaches the throttle portion 76c is reduced. Therefore, the residence time until the processing gas introduced into the injector 77 from the introduction port 77b reaches the throttle portion 77c can be made to approach the residence time until the processing gas introduced into the injector 76 from the introduction port 76b reaches the throttle portion 76c. As a result, the thermal decomposition rate of the processing gas in the injector 77 can be made to be about the same as the thermal decomposition rate of the processing gas in the injector 76.

Figure 8:
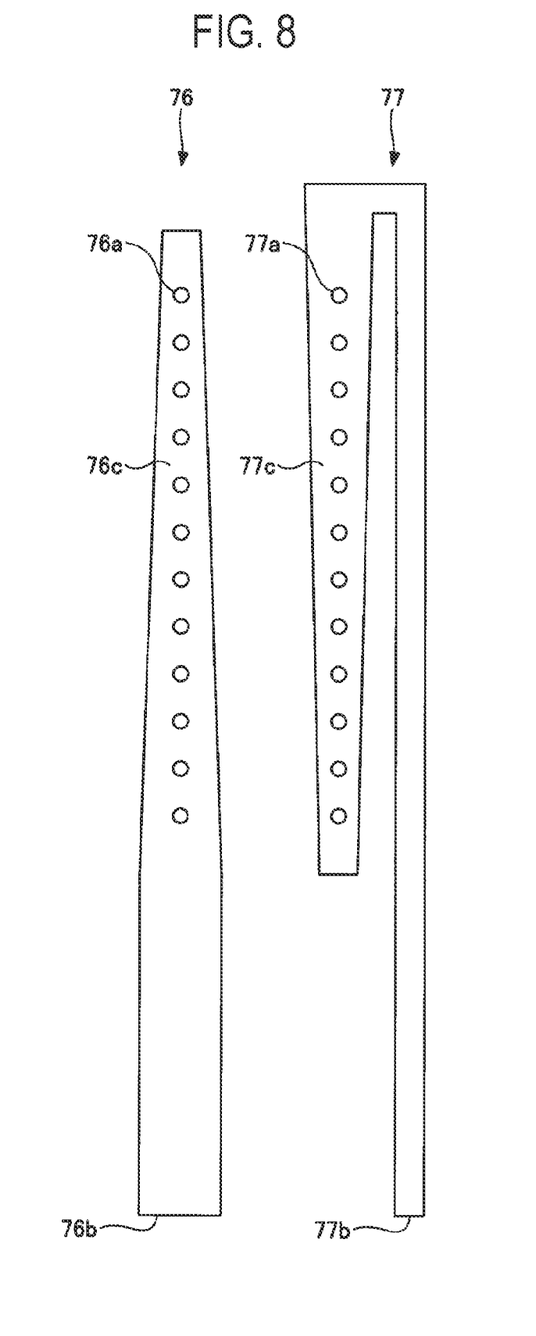
FIG. 8 is a schematic view of in injector when viewed from the center side in the radial direction of the processing container.

In addition, as illustrated in FIG. 2, the injector 77 is disposed such that the upper end of the upper portion folded from the upper side toward the lower side is at the same height as the upper end of the injector 76. However, the injector 77 may be disposed such that the upper end of the upper portion folded from the upper side toward the lower side is at a height different from the upper end of the injector 76, for example, at a height higher than the upper end of the injector 76, as illustrated in FIG. 8.

When a silicon-containing gas, which is a raw-material gas, is introduced into an injector, the silicon-containing gas is heated by the heater while flowing from the upstream to the downstream inside the injector. Therefore, the silicon-containing gas ejected from the gas hole located upstream of the gas flow and the silicon-containing gas ejected from the gas hole located downstream differ in the heating time in the injector. As a result, the flow rate and the thermal decomposition rate differ between the silicon-containing gas ejected from the gas hole located upstream and the silicon-containing gas ejected from the gas hole located downstream, variation in the uniformity of film characteristics occurs between the substrates W.

The processing apparatus 10 of the embodiment includes an upright diffusion injector (the injector 76), the lower portion of which is the upstream side of the gas flow, and the upper portion of which is the downstream side of the gas flow, and a folded diffusion injector (the injector 77), the upper portion of which is the upstream side of the gas flow, and the lower portion of which is the downstream side of the gas flow. That is, the injectors 76 and 77 included in the processing apparatus 10 of the embodiment have a positional relationship in which the upstream side and the downstream side of the gas flow are upside down. As a result, by supplying the same raw-material gas (e.g., a silicon-containing gas) from the injectors 76 and 77 at the same time, the non-uniformity of the supply of the raw-material gas in the vertical direction can be offset.

In addition, according to the processing apparatus 10 of the embodiment, the injectors 76 and 77 include throttle portions 76c and 77c having cross-sectional areas that decreases as the distance from the introduction ports 76b and 77b increase, respectively. This makes it possible to suppress a decrease in the flow velocity on the downstream side of the gas flow. Thus, the uniformity of the thermal decomposition rate of the raw-material gas in the vertical direction is improved.

Thus, it is possible to improve the uniformity of the mass flow rate and the thermal decomposition rate of the raw-material gas, which is ejected toward the substrates W, in the vertical direction. As a result, the uniformity of the film characteristics of silicon films to be formed between the substrates W is improved.

[Analysis Results]

The results of analysis by computational fluid dynamics (CFD) (hereinafter referred to as "CFD analysis") will be described with reference to FIGS. 9 to 13.

In the CFD analysis, it has been analyzed how the mass flow rate of the entire gas, and the mass flow rate and the mole fraction of the reaction active species ($SiH_2$) within an injector are changed when the shape of the injector used to supply a raw-material gas ($Si_2H_6$) into the processing container 34 was changed. The mass flow rate and mole fraction of the reaction active species ($SiH_2$) were analyzed in consideration of the fact that the thickness of a film deposited on a substrate W is associated with the concentration of reaction active species ($SiH_2$) generated by the thermal decomposition of a raw-material gas ($Si_2H$).

First, with reference to FIGS. 9 to 11, the results of analyzing the mass flow rate of the entire gas and the mass flow rate of $SiH_2$ when ejecting $Si_2H_6$ using four injectors A to D having different shapes will be described.

Figure 9:
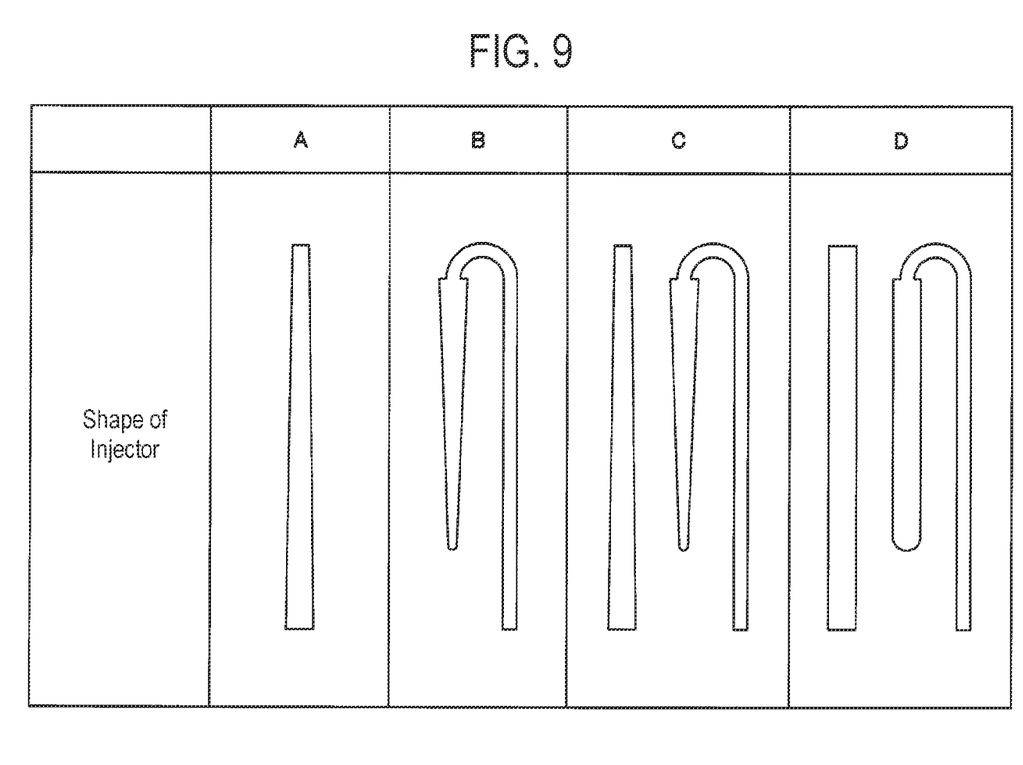
FIG. 9 is a view illustrating the different shapes of four injectors used in an analysis.

FIG. 9 is a view illustrating the shapes of the four different injectors A to D used in the analysis. In FIG. 9, illustration of gas holes is omitted.

As illustrated in FIG. 9, the injector A is a truncated cone-shaped upright distribution injector that has the same structure as the injector 76 illustrated in FIG. 7 and has a cross-sectional area that decreases as the distance from the introduction port at the lower end increases. The injector B is a truncated cone-shaped folded distribution injector has the same structure as the injector 77 illustrated in FIG. 7 and includes a downward extending portion that has a cross-sectional area that decreases as the distance from the introduction portion increases. The injector C is a type obtained by combining the injector A and the injector B. The injector D is a type obtained by combining a cylindrical upright diffusion injector having a constant cross-sectional area from the lower end to the upper end and a cylindrical folded diffusion injector having a downward extending portion extending having a constant cross-sectional area.

Figure 10:
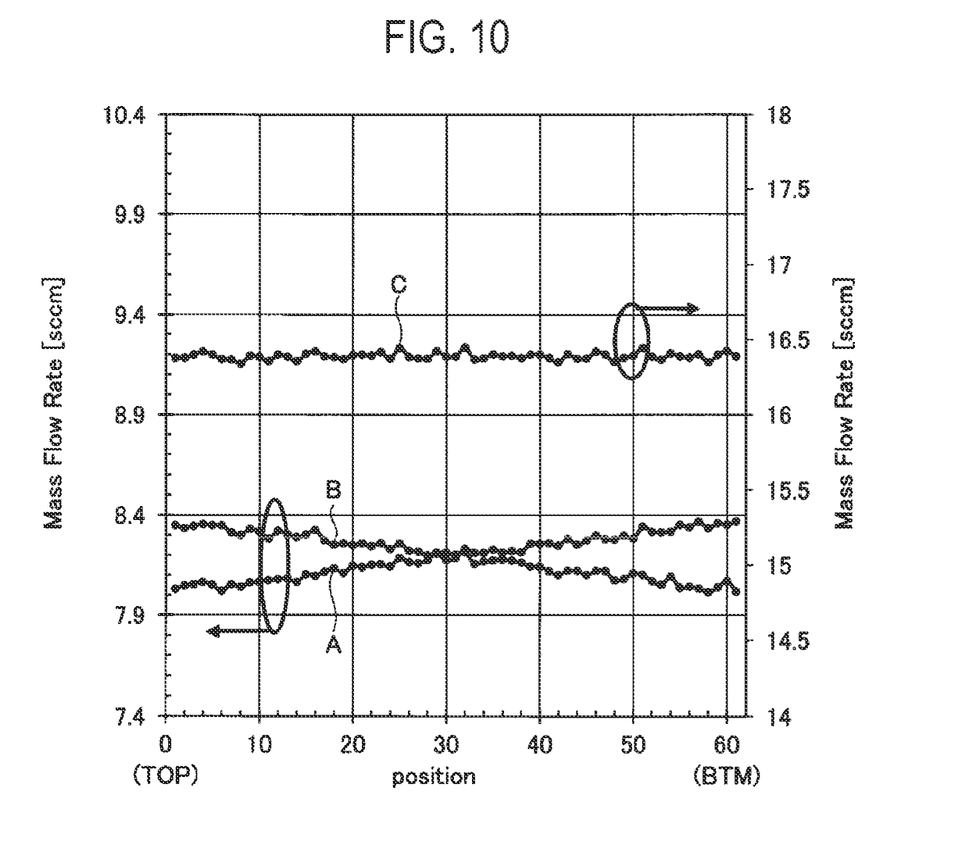
FIG. 10 is a diagram showing the analysis results of mass flow rate of entire gas.

FIG. 10 is a diagram showing the analysis results of mass flow rate of the entire gas. In FIG. 10, the horizontal axis represents the position of a gas hole, and the vertical axis represents the mass flow rate [sccm] of the entire gas. The position of a gas hole indicates the number of the gas hole arranged from the top.

As shown in FIG. 10, when the injector C was used, the uniformity of the mass flow rate of the entire gas in the vertical direction is improved compared with the case in which the injectors A and B were used. From this result, it was shown that when the truncated cone-shaped upright diffusion injector and the truncated cone-shaped folded diffusion injector are used, the uniformity of the mass flow rate of the entire gas in the vertical direction is improved.

Figure 11:
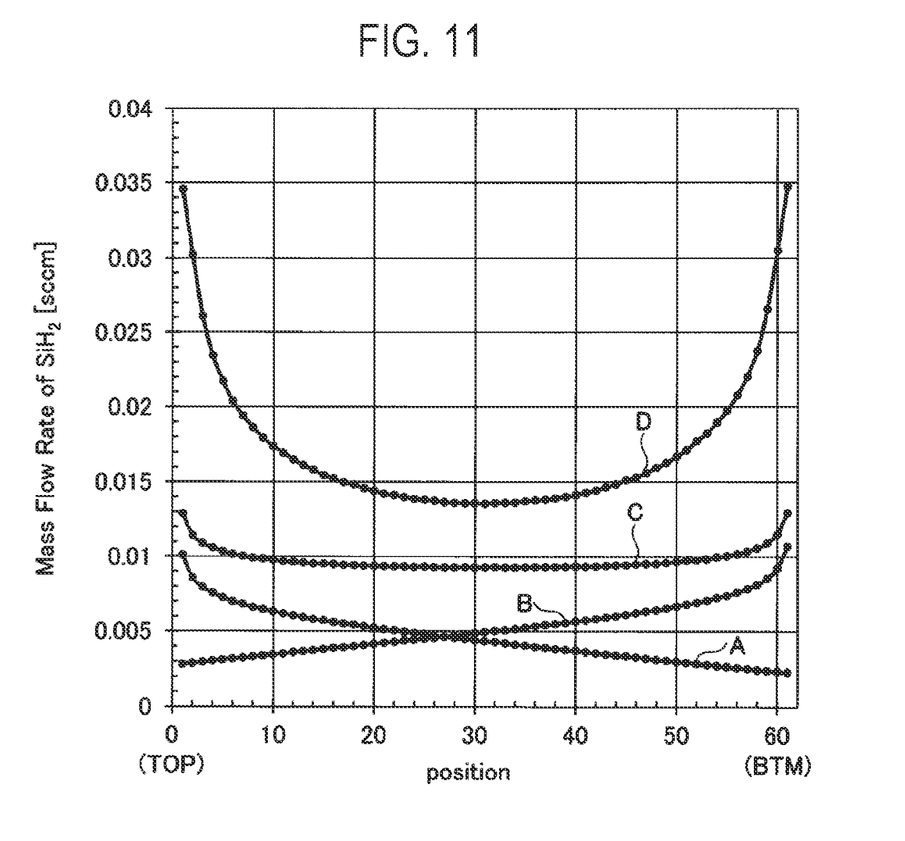
FIG. 11 is a diagram showing the analysis results of mass flow rate of $SiH_2$.

FIG. 11 is a diagram showing the analysis results of mass flow rate of $SiH_2$. In FIG. 11, the horizontal axis represents the position of a gas hole, and the vertical axis indicates the mass flow rate of $SiH_2$ [sccm]. The position of a gas hole indicates the number of the gas hole arranged from the top.

As shown in FIG. 11, when the injector C was used, the uniformity of the mass flow rate of $SiH_2$ in the vertical direction is improved compared with the case in which the injectors A, B, and D were used. The results showed that when the truncated cone-shaped upright diffusion injector and the truncated cone-shaped folded diffusion injector are used, the uniformity of the mass flow rate of $SiH_2$ in the vertical direction is improved. That is, it can be said that the uniformity of the thermal decomposition rate of $Si_2H_6$ in the vertical direction is improved by using the truncated cone-shaped upright diffusion injector and the truncated cone-shaped folded diffusion injector.

Next, with reference to FIGS. 12 and 13, the results of analyzing the thermal decomposition rate of $SiH_2$ when ejecting $Si_2H_6$ using five injectors E to I having different shapes will be described.

Figure 12:
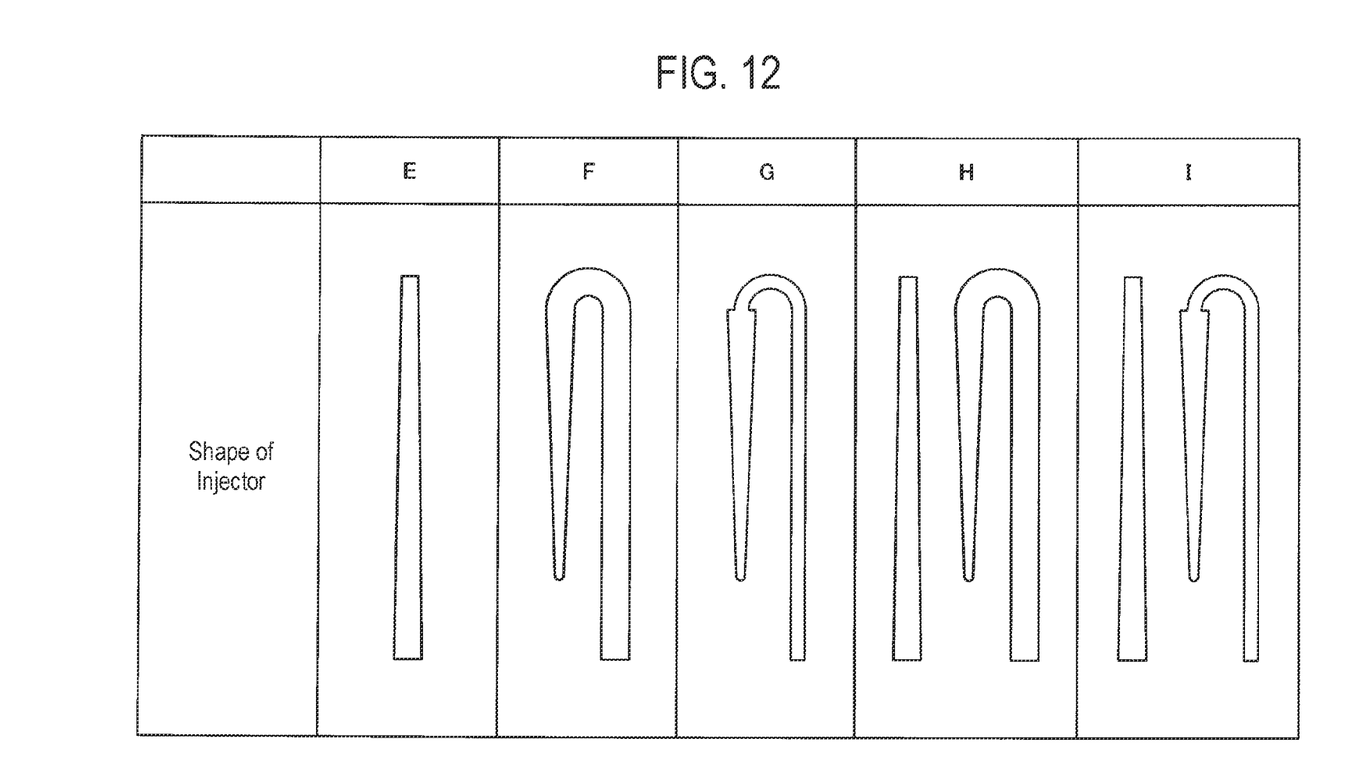
FIG. 12 is a view illustrating the different shapes of five injectors used in an analysis.

FIG. 12 is a diagram showing the different shapes of the five injectors E to I used in the analysis. In FIG. 12, illustration of gas holes is omitted.

As illustrated in FIG. 12, the injector E is a truncated cone-shaped upright distribution injector that has the same structure as the injector 76 illustrated in FIG. 7 and has a cross-sectional area that decreases as the distance from the introduction port at the lower end increases. The injector F is a truncated cone-shaped folded distribution injector has the same structure as the injector 77 illustrated in FIG. 2 and includes a downward extending portion that has a cross-sectional area that decreases as the distance from the introduction port increases. The injector G is a truncated cone-shaped folded distribution injector has the same structure like the injector 77 illustrated in FIG. 7 and includes a downward extending portion that has a cross-sectional area that decreases as the distance from the introduction port increases. The injector H is a type obtained by combining the injector E and the injector F. The injector I is a type obtained by combining the injector E and the injector G.

Figure 13:
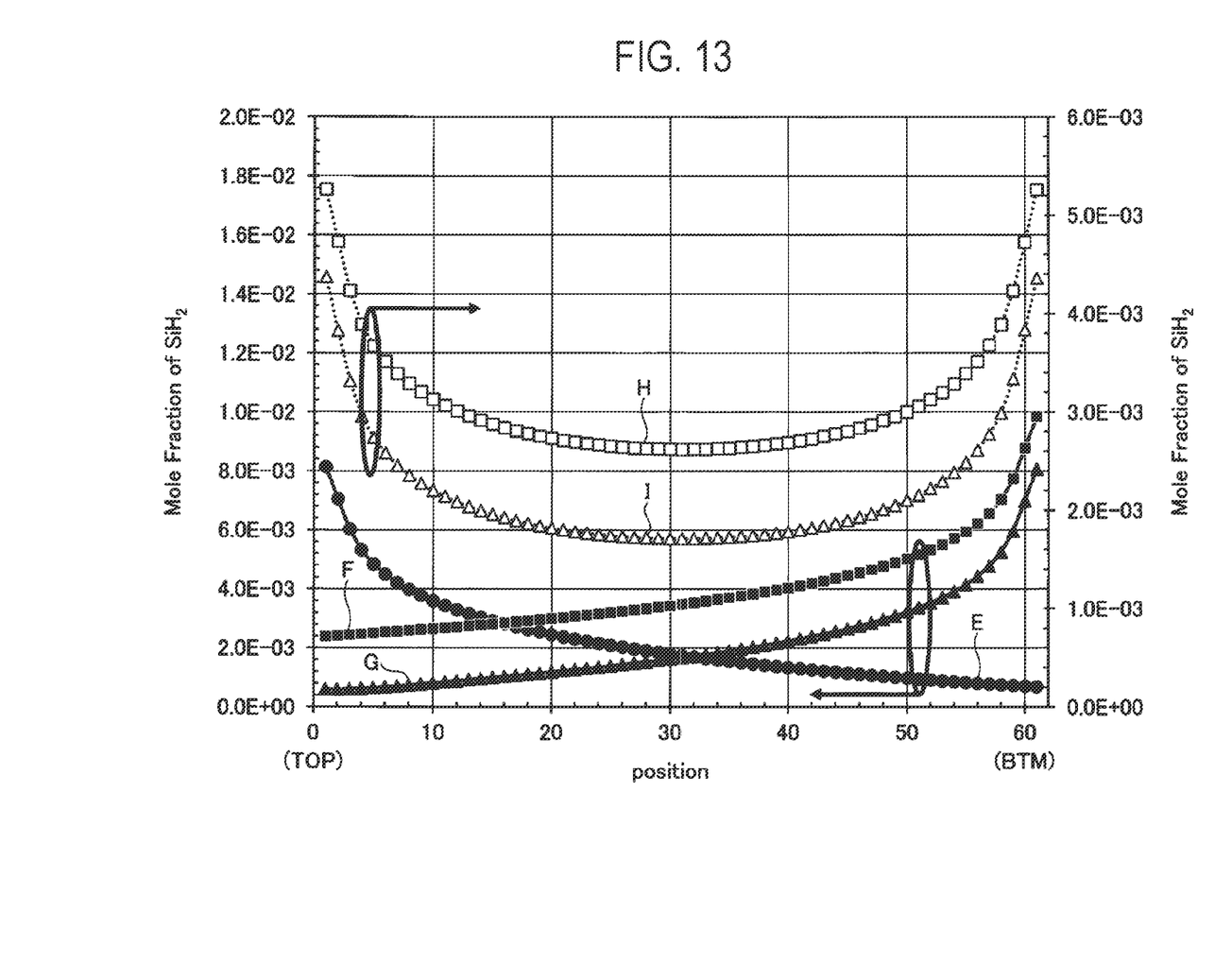
FIG. 13 is a diagram showing the analysis results of mole fraction of $SiH_2$.

FIG. 13 is a diagram showing the analysis results of mole fraction of $SiH_2$. In FIG. 13, the horizontal axis represents the position of a gas hole, and the vertical axis indicates the mole fraction of $SiH_2$. The position of a gas hole indicates the number of the gas hole arranged from the top.

As shown in FIG. 13, it can be seen that when the injectors H and I were used, the uniformity of the mole fraction of $SiH_2$ in the vertical direction is improved compared with the case in which the injectors E, F, and G were used. From this result, it was shown that when the truncated cone-shaped upright diffusion injector and the truncated cone-shaped folded diffusion injector are used, the uniformity of the mole fraction of $SiH_2$ in the vertical direction is improved. That is, it can be said that the uniformity of the thermal decomposition rate of $Si_2H_6$ in the vertical direction is improved by using the truncated cone-shaped upright diffusion injector and the truncated cone-shaped folded diffusion injector.

In addition, as shown in FIG. 13, it can be seen that when the injector G was used, the mole fraction of $SiH_2$ is shifted in the direction of becoming smaller compared with the case in which the injector F was used. In addition, it can be seen that in the case in which the injector I was used, the mole fraction of $SiH_2$ is similarly shifted in the direction of becoming smaller compared with the case in which the injector H was used. From this result, it was shown that it is possible to reduce the mole fraction of $SiH_2$ by reducing the cross-sectional area of the upward extending portion in the truncated cone-shaped folded diffusion injector.

In the above embodiments, the injector 76, the gas holes 76a, the introduction port 76b, and the throttle portion 76c are examples of the first injector, the first gas holes, the first introduction port, and the first throttle portion, respectively. In addition, the injector 77, the gas holes 77a, the introduction port 77b, and the throttle portion 77c are examples of the second injector, the second gas holes, the second introduction port, and the second throttle portion, respectively.

It should be understood that the embodiments disclosed herein are exemplary in all respects and are not restrictive. The above-described embodiments may be omitted, replaced, or modified in various forms without departing from the scope and spirit of the appended claims.

According to the present disclosure, the inter-plane uniformity of gas supply to substrates can be adjusted.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing apparatus comprising:
   a processing container having a cylindrical shape;
   a first injector extending in a longitudinal direction along an inner side of an inner wall of the processing container, wherein the first injector includes a first introduction port formed at a lower end and first gas holes formed in the extending portion; and
   a second injector extending upward along the inner side of the inner wall of the processing container, folded back at an upper portion, and then extending downward, wherein the second injector includes a second introduction port formed at a lower end of an upward extending portion and second gas holes formed in a downward extending portion,
   wherein the first injector includes a first throttle portion having a cross-sectional area decreasing as a distance from the first introduction port increases,
   wherein the second injector includes a second throttle portion formed in the downward extending portion and having a cross-sectional area decreasing as a distance from the second introduction port increases, and
   wherein a surface of the first throttle portion in which the first gas holes are formed and a surface of the second throttle portion in which the second gas holes are formed are parallel to each other in a vertical direction.

2. The processing apparatus of claim 1, wherein, in the second injector, a cross-sectional area of the upward extending portion is smaller than a cross-sectional area of the downward extending portion.

3. The processing apparatus of claim 2, wherein the first gas holes and the second gas holes are arranged at a same height position.

4. The processing apparatus of claim 3, wherein the first throttle portion and the second throttle portion have a cone shape or a truncated cone shape.

5. The processing apparatus of claim 1, wherein the first gas holes and the second gas holes are arranged at a same height position.

6. The processing apparatus of claim 1, wherein the first throttle portion and the second throttle portion have a cone shape or a truncated cone shape.

* * * * *